(12) United States Patent
Park et al.

(10) Patent No.: US 7,599,403 B2
(45) Date of Patent: Oct. 6, 2009

(54) SUPERLUMINESCENT DIODE AND METHOD OF MANUFACTURING THE SAME

(75) Inventors: Moon Ho Park, Daejeon (KR); Yong Soon Baek, Daejeon (KR); Kwang Ryong Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/635,195

(22) Filed: Dec. 7, 2006

(65) Prior Publication Data

US 2007/0223551 A1 Sep. 27, 2007

(30) Foreign Application Priority Data

Dec. 12, 2005 (KR) .................. 10-2005-0121981

(51) Int. Cl.
*H01S 3/00* (2006.01)
*H01S 5/00* (2006.01)
(52) U.S. Cl. ........................ 372/1; 372/50.22
(58) Field of Classification Search .......... 372/50.22, 372/1, 50.1, 46.015
See application file for complete search history.

(56) References Cited

U.S. PATENT DOCUMENTS

| 5,034,955 | A | | 7/1991 | Kashima et al. |
| 5,223,722 | A | | 6/1993 | Nagai et al. |
| 5,792,674 | A | * | 8/1998 | Kitamura ................. 438/31 |
| 6,704,338 | B2 | * | 3/2004 | Yoshida .................. 372/50.22 |
| 7,199,441 | B2 | * | 4/2007 | Shimizu et al. ............ 257/446 |
| 7,378,292 | B2 | * | 5/2008 | Park et al. ................. 438/31 |
| 2003/0185256 | A1 | * | 10/2003 | Aoki ......................... 372/20 |
| 2004/0125851 | A1 | * | 7/2004 | Park et al. ................... 372/97 |

OTHER PUBLICATIONS

C.-F. Lin et al., Superluminescent Diodes with Bent Waveguide, IEEE Photonics Technology Letters, Feb. 1996, vol. 8, No. 2, pp. 206-208.*
Mikami, O. et al., "Emission Spectral Width Broadening for InGaAsP/InP Superluminescent Diodes", Apr. 1991, *IEE Proceedings-J*, vol. 138, No. 2.
Holtmann, Ch. et al., "High Power Superluminescent Diodes for 1.3μm Wavelengths", Aug. 29, 1996, *Electronics Letters* vol. 32, No. 18.
Liou, K.-Y. et al., "Monolithically Integrated Semiconductor LED-Amplifier for Applications as Transceivers in Fiber Access Systems", Jun. 1996, *IEEE Photonics Technology Letters* vol. 8, No. 6.

* cited by examiner

*Primary Examiner*—Armando Rodriguez
(74) *Attorney, Agent, or Firm*—Ladas & Parry LLP

(57) ABSTRACT

A 1.55 μm SLD having a laser diode (LD) region and a semiconductor optical amplifier (SOA) region, and a method of fabricating the same, are disclosed. The SLD includes: an InP substrate having a LD region and a SOA region for amplifying light emitted from the LD region; an optical waveguide having a BRS (buried ridge strip) structure having an active layer of resonant strip pattern formed on the InP substrate and extending from the SOA region to the LD region; a first electrode formed on the active layer in the SOA region, a second electrode formed on the active layer in the LD region and electrically isolated from the first electrode; and a current blocking region interposed between the first electrode and the second electrode in order to electrically isolate the first electrode and the second electrode from each other.

16 Claims, 11 Drawing Sheets

SUPERLUMINESCENT DIODE AND METHOD OF MANUFACTURING THE SAME

CROSS-REFERENCE TO RELATED PATENT APPLICATION

This application claims the benefit of Korean Patent Application No. 10-2005-0121981, filed on Dec. 12, 2005, in the Korean Intellectual Property Office, the disclosure of which is incorporated herein in its entirety by reference.

BACKGROUND OF THE INVENTION

1. Field of the Invention

The present invention relates to a high power semiconductor light source and a method of manufacturing the same, and more particularly, to a superluminescent diode (SLD) which emits light of 1.55 μm wavelength, and a method of manufacturing the same.

2. Description of the Related Art

Conventional light sources for optical communication, optical measurement and bio-imaging generally emit visible light or light of 1.3 μm wavelength. There has been very little research into a superluminescent diode (SLD) which emits light of 1.55 μm wavelength, until now.

Conventional structures for suppressing laser oscillation of an SLD include: i) an inclined resonating axis; ii) an optical absorption layer formed by ion implantation; and iii) a window structure without an active layer. Important variables of an SLD are its optical power, spectrum width, and modulation depth. An SLD generating an optical power greater than 100 mW receives an injection current of several amperes and has an optical power waveguide having a width of several tens of μm, which is much wider than a waveguide used in a communication device. For example, the width of the waveguide for a communication device is about 2 to 3 μm. Since an injection current of less than 200 mA is supplied to SLDs for optical communication and bio-imaging, these SLDs cannot generate an optical power greater than 20 mW.

Therefore, there is a demand for an SLD generating an optical power greater than 20 mW and having an optical power spectrum wider than 20 nm to provide broadband characteristics.

SUMMARY OF THE INVENTION

The present invention provides a superluminescent diode (SLD) for emitting radiation with a wavelength of 1.55 μm as a light source for optical networking, wave division multiplexed (WDM) optical communication, and bio-imaging equipment.

The present invention also provides a method of fabricating a superluminescent diode (SLD) for emitting radiation with a wavelength of 1.55 μm as a light source for optical networking, wave division multiplexed (WDM) optical communication, and bio-imaging equipment.

According to an aspect of the present invention, there is provided a superluminescent diode (SLD) including: an InP substrate having a LD (laser diode) region and a SOA (semiconductor optical amplifier) region for amplifying light emitted from the LD region; an optical waveguide having a BRS (buried ridge strip) structure having an active layer of resonant stripe pattern formed on the InP substrate and extending from the SOA region to the LD region; a first electrode formed on the active layer in the SOA region, a second electrode formed on the active layer in the LD region and electrically isolated from the first electrode; and a current blocking region interposed between the first electrode and the second electrode to electrically isolate the first electrode and the second electrode from each other.

The current blocking region may be formed of an ion-implanted InP clad layer that is formed on the active layer.

A p-InP clad layer and a p-InGaAs ohmic contact layer may be sequentially stacked between the active layer and the first electrode, and between the active layer and the second electrode.

The SLD may further include an antireflection layer coated on a light output surface of the SOA region. The active layer in the LD region may have a bent waveguide structure.

According to another aspect of the present invention, there is provided a method of fabricating an SLD (superluminescent diode) including: forming an active layer having a ridge structure on an InP substrate which includes a LD (laser diode) region and a SOA (semiconductor optical amplifier) region for amplifying light generated by the LD region and extended from the SOA region to the LD region; forming an optical waveguide having a BRS (buried ridge strip) structure by sequentially forming a p-InP clad layer and a p-InGaAs ohmic contact layer on the active layer; forming a current blocking region by performing ion implantation on the p-InGaAs ohmic contact layer except in the SOA region and the LD region; forming a first p-InGaAs ohmic contact pattern and a second p-InGaAs ohmic contact layer pattern in the SOA region and the LD region by patterning the p-InGaAs ohmic contact layer; forming an insulating layer pattern having a first opening that exposes the first p-InGaAs ohmic contact layer pattern in the SOA region and a second opening that exposes the second p-InGaAs ohmic contact layer pattern in the LD region; forming a first electrode to contact the first p-InGaAs ohmic contact layer pattern through the first opening in the SOA region; and forming a second electrode to contact the second p-InGaAs ohmic contact layer pattern through the second opening the LD region.

The first electrode and the second electrode may be formed at the same time.

The method may further include coating a light output surface of the SOA region with an antireflection layer.

The first electrode and the second electrode may be formed to be electrically isolated from each other by the current blocking region.

According to the present invention, the 1.55 μm SLD may be manufactured by forming two electrodes for the SOA and LD at the same time. By forming the SOA and the LD on the same active layer, the 1.55 μm SLD outputs high power and has broadband characteristics.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

FIGS. 1 through 9 are perspective views of an SLD for describing a method of manufacturing a superluminescent diode (SLD) according to an embodiment of the present invention.

Figure 1:
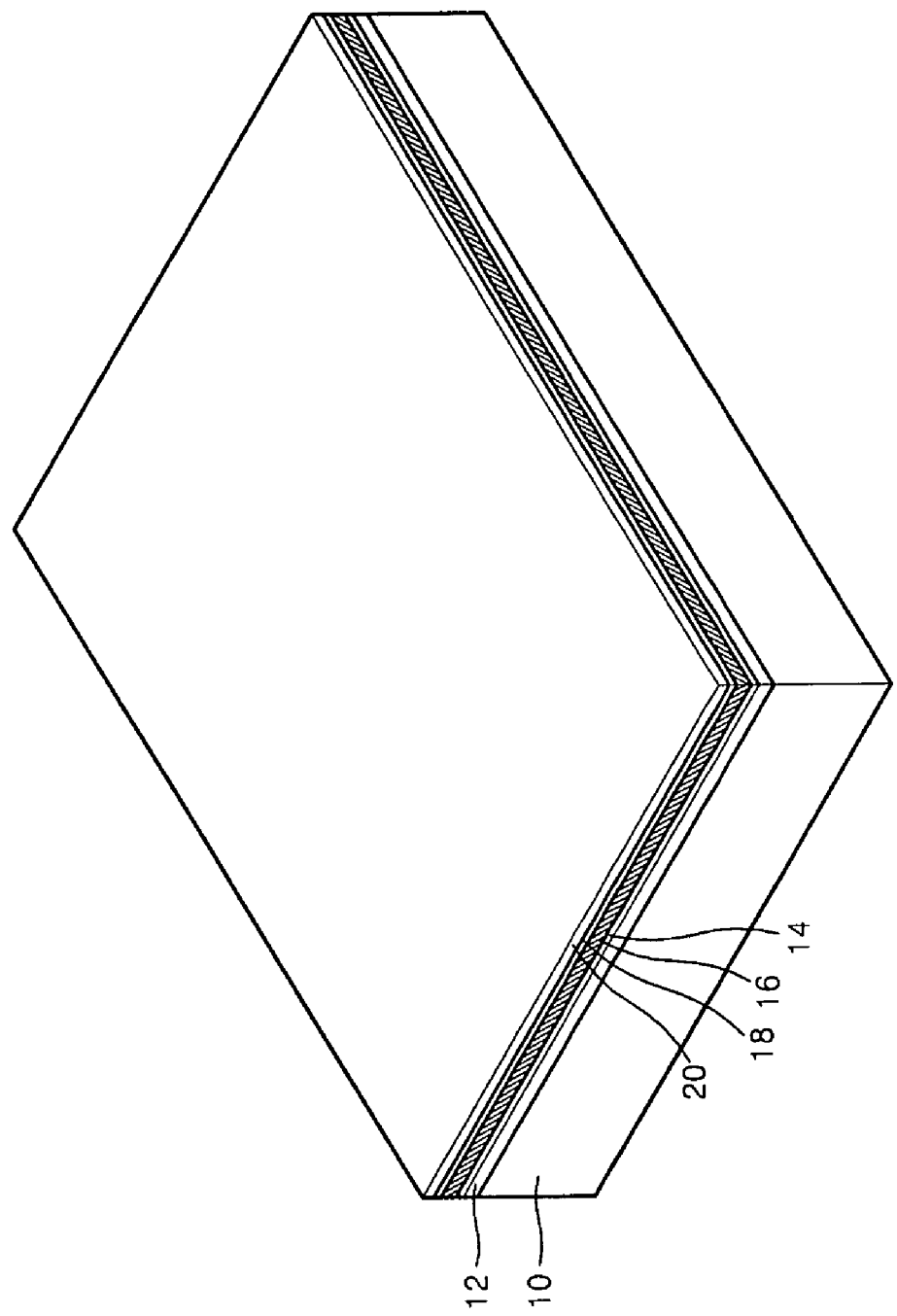
FIGS. 1 through 9 are perspective views of an SLD for describing a method of manufacturing a superluminescent diode (SLD) according to an embodiment of the present invention.

Referring to FIG. 1, an InP buffer layer 12 ($\lambda$=1.3 μm and thickness=0.3 μm) and a first separate confinement heterostructure layer (SCH) layer 14 ($\lambda$=1.3 μm and thickness=0.07 μm) are sequentially formed on an n-InP substrate 10 by metal organic chemical vapor deposition (MOCVD).

An active layer 16 is then formed on the first SCH layer 14. For example, a multi-quantum well (MQW) can be formed by alternately depositing unstrained InGaAsP barriers ($\lambda$=1.68 μm and thickness=11.5 nm) and 0.8% InGaAsP strained well layers ($\lambda$=1.3 μm and thickness=7 nm) several times. For example, the active layer 16 can be formed by depositing seven pairs of an unstrained InGaAsP barrier and an InGaAsP strained well layer.

A second SCH layer 18 ($\lambda$=1.3 μm and thickness=0.07 μm) is formed on the active layer 16. Thereafter, a passivation layer 20 is deposited to protect the active layer 16. The passivation layer 20 may be a p-InP layer having a thickness of 0.1 μm.

Figure 2:
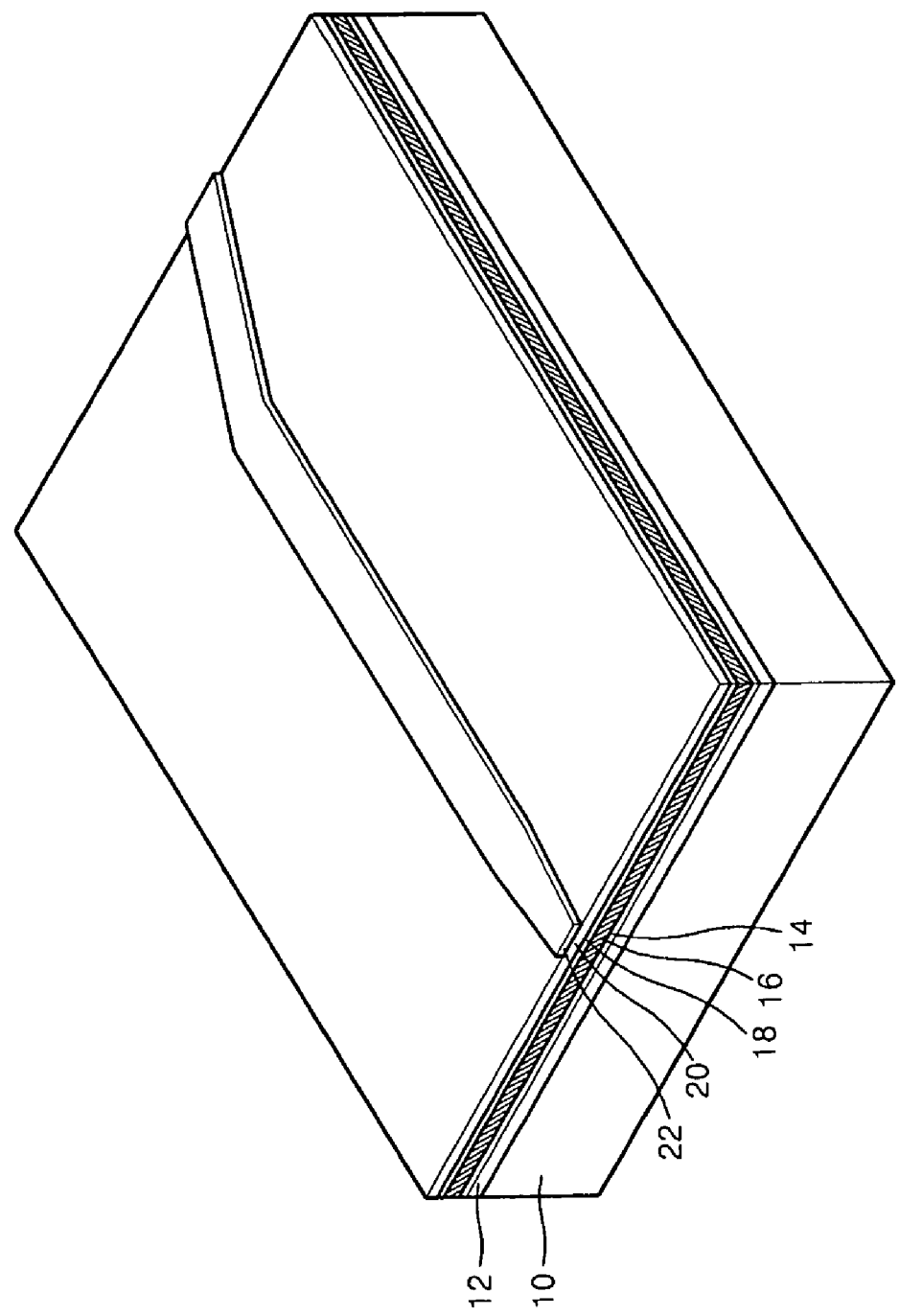

FIG. 2 shows the result of a photolithography process for forming a resonant stripe pattern.

A first insulating layer pattern 22 is formed on the passivation layer 20 to a thickness of 0.2 μm by plasma enhanced CVD (PECVD). In order to form the first insulating layer pattern 22, a first insulating layer including, for example, $SiO_x$ and $SiN_x$, is formed on the passivation layer 20, and a photo-resist pattern (not shown) is formed on the first insulating layer in a <110> direction with a line width of 2 μm, for a resonant stripe pattern. Then, the first insulating layer pattern 22 is formed by dry etching the first insulating layer using the photo-resist pattern as an etching mask, for example, by MERIE (Magnetic Enhanced Reactive Ion Etching). The first insulating layer pattern 22 is formed in a resonant stripe pattern, and then the photo-resist pattern is removed. It is also possible to leave the photo-resist pattern on the first insulating pattern 22, to be used for a subsequent etching process.

Figure 3:
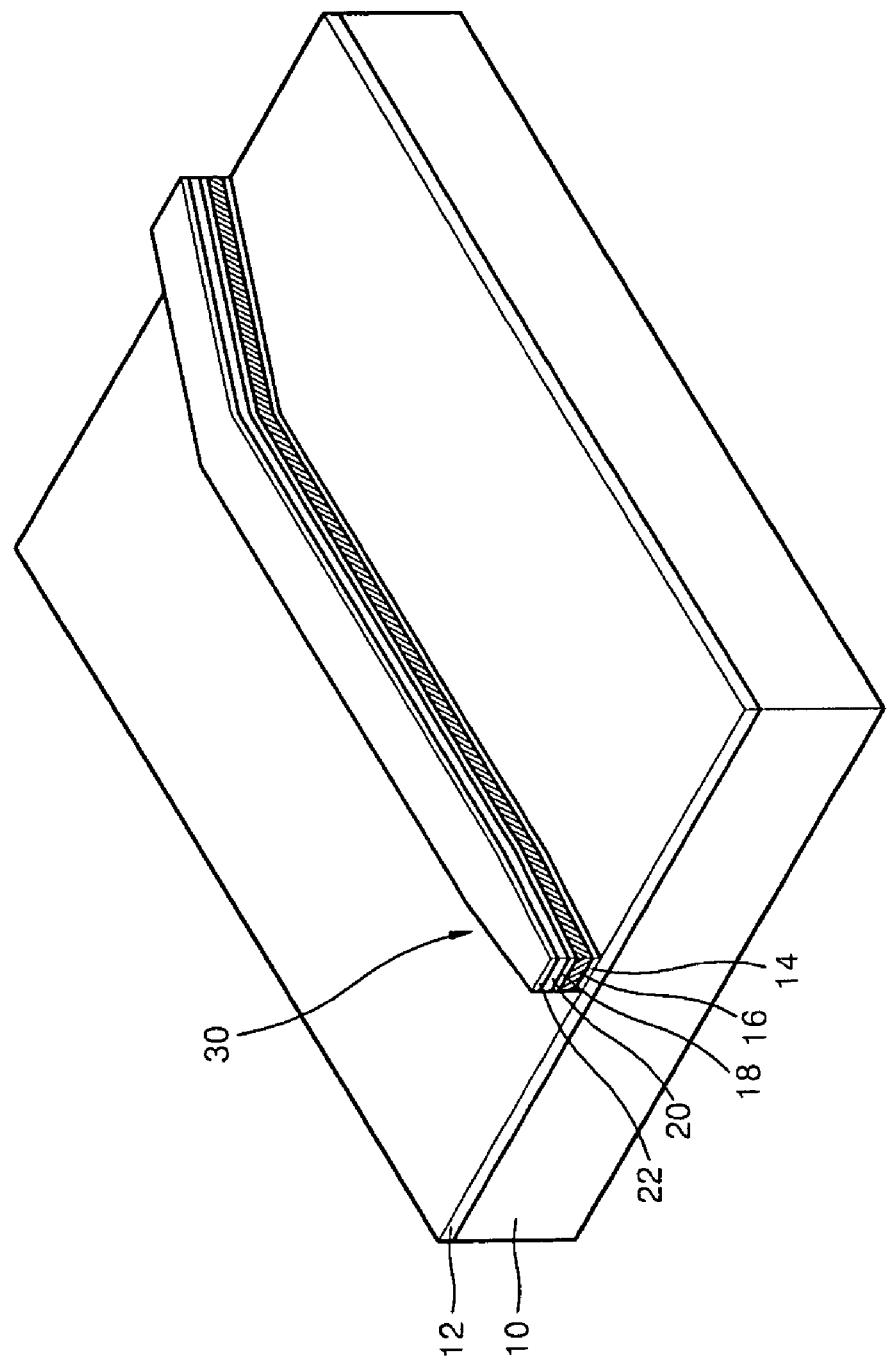

Referring to FIG. 3, a resonant stripe pattern 30 is formed in a <110> direction with a line width of 2 μm by sequentially dry-etching the passivation layer 20, the second SCH layer 18, the active layer 16 and the first SCH layer 14. In order to remove a damaged surface layer left by the dry-etching process, the etched product is cleaned with a sulfuric acid solution for two minutes, and the damaged surface layer is etched back by about 100 nm by wet-etching using an etching solution such as $HBr:H_2O_2:H_2O$=8:2:100 (weight ratio), for 60 seconds.

Figure 4:
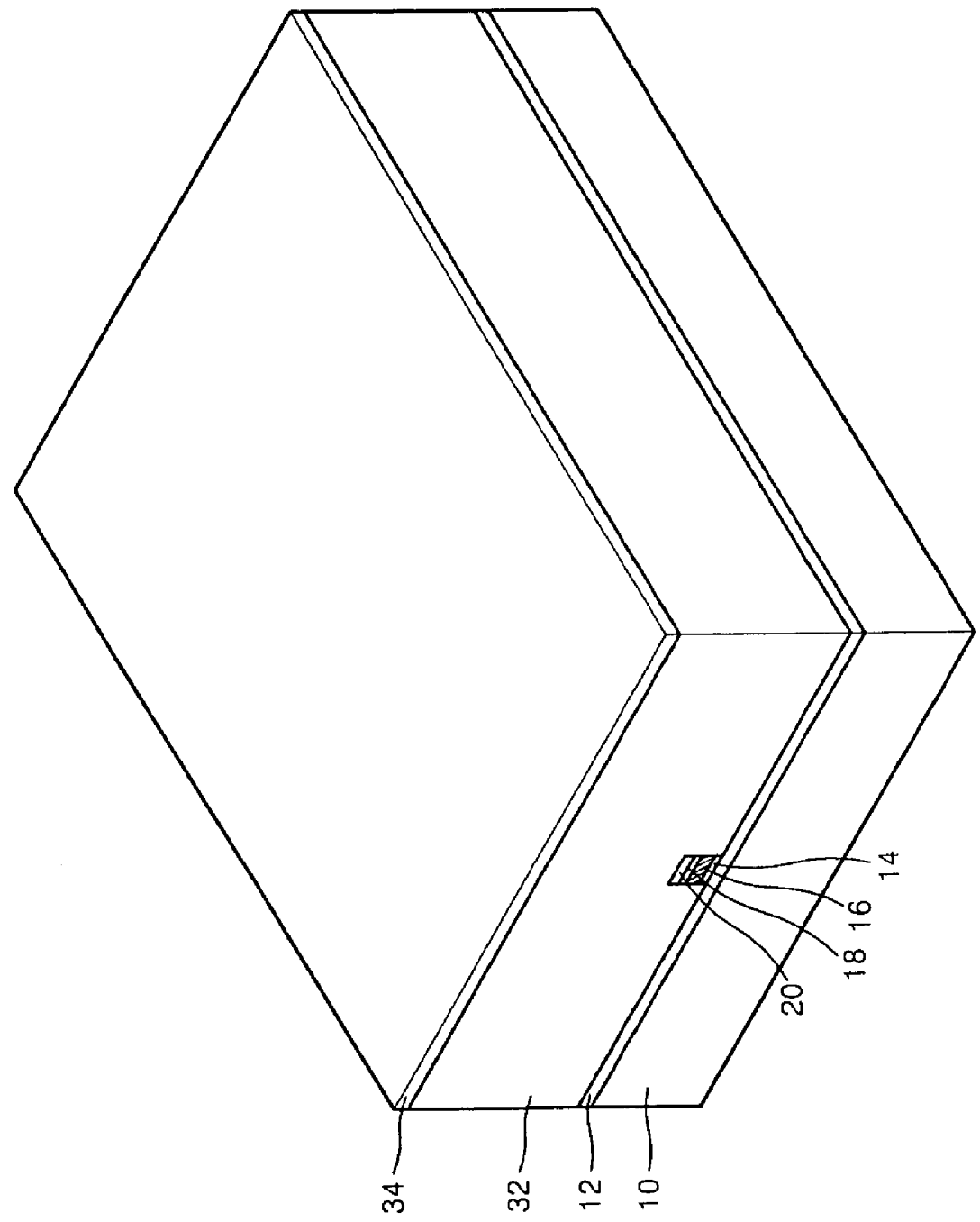

Referring to FIG. 4, after removing the first insulating pattern 22, a p-InP clad layer 32 and a p-InGaAs ohmic contact layer 34 are formed by growing an epitaxial layer on the structure having the resonant stripe pattern 30 by MOCVD. As a result, an optical waveguide having a buried ridge stripe (BRS) structure is formed. The p-InP clad layer 32 may have a doping concentration of about $2 \times 10^{18}$ $cm^{-3}$ and a thickness of 1.5 μm. The p-InGaAs ohmic contact layer 34 may be formed to a thickness of about 0.2 μm.

An InP layer (not shown) may be formed on the p-InGaAs ohmic contact layer 34 to a thickness of about 0.2 μm as a passivation layer to protect the lower layers, and may be also used for removing the photo-resist pattern after the ion-implantation process for doping in a later process. This will be described later.

Figure 5:
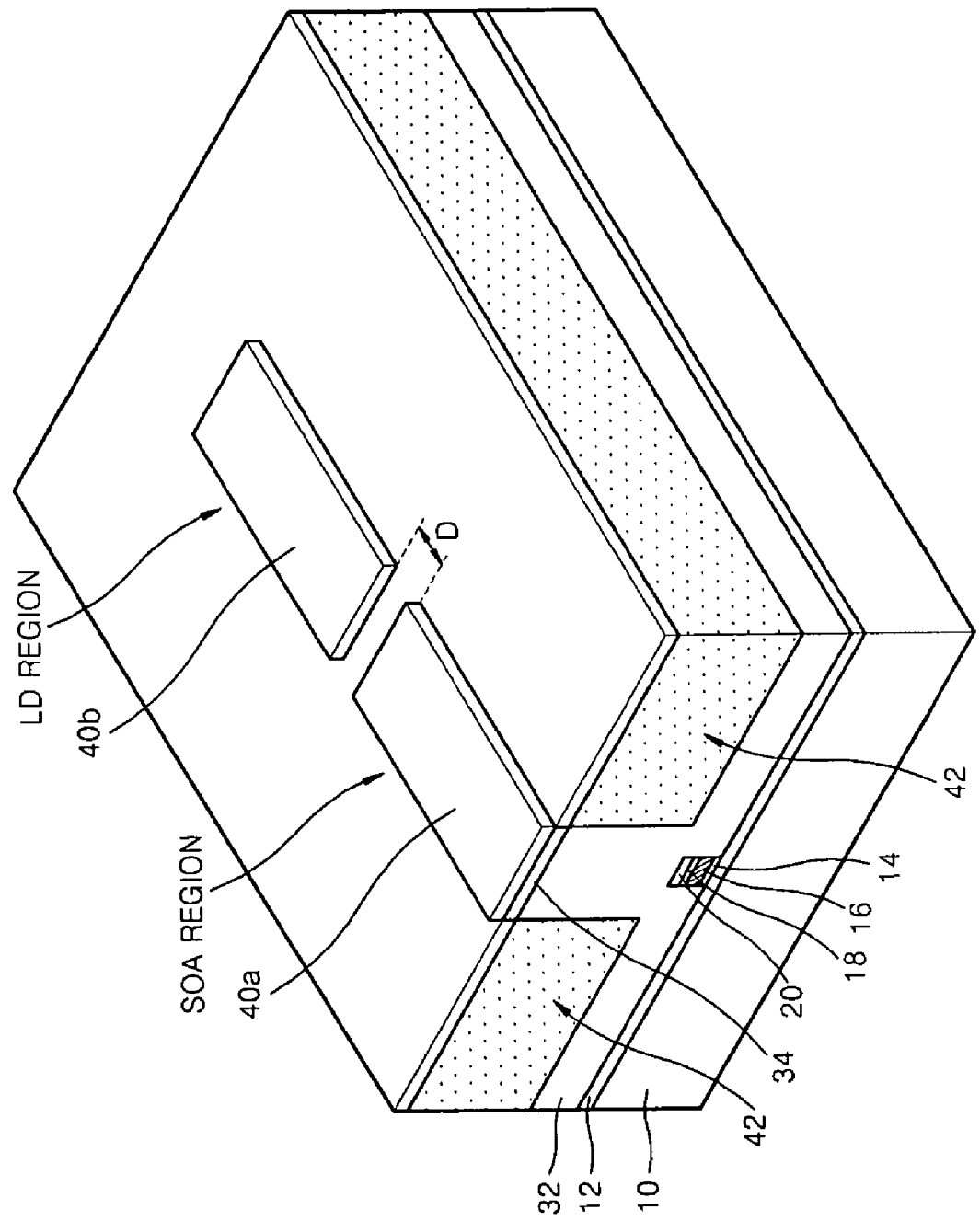

Referring to FIG. 5, after forming the BRS structure by forming the p-InP clad layer 32 and the p-InGaAs ohmic contact layer 34, a current blocking area 42 is formed by ion implantation to limit the injection current in the active layer 16. In order to protect the active layer during the ion implantation, first and second photo-resist stripe patterns 40a and 40b are formed on the p-InGaAs ohmic contact layer 34 to a thickness of 5 μm and a width of 6 μm. The first and second photo-resist stripe patterns 40a and 40b define a semiconductor optical amplifier (SOA) region and a laser diode (LD) region, respectively. The first photo-resist stripe pattern 40a is formed on the SOA region and the second photo-resist stripe pattern 40b is formed on the LD region.

When using the first and the second photo-resist stripe patterns 40a and 40b as an ion-implantation mask, the ion-implantation process must be performed under optimized conditions in which variables such as the type of ion, the acceleration voltage and the dose are closely controlled. For example, protons ($H^+$ ions) and oxygen ion may be used, and the acceleration voltage may be several hundred keV. The acceleration voltage may vary according to the thickness of the p-InP clad layer 32. The dose is about $2 \times 10^{14}$ $ions/cm^2$ in the case of protons.

A current blocking region 42 is formed in the p-InGaAs ohmic contact layer 34 and the p-InP clad layer 32 by performing the ion-implantation using the first and the second photo-resist stripe pattern 40a and 40b as an ion-implantation mask. The current blocking region 42 is formed in the regions which are not covered by the first and the second photo-resist stripe pattern 40a and 40b. Therefore, the current blocking region is formed in a region D between the SOA region covered with the first photo-resist stripe pattern 40a and the LD region covered with the second photo-resist stripe pattern 40b. Therefore, the SOA region and the LD region are electrically isolated from each other.

Figure 6:
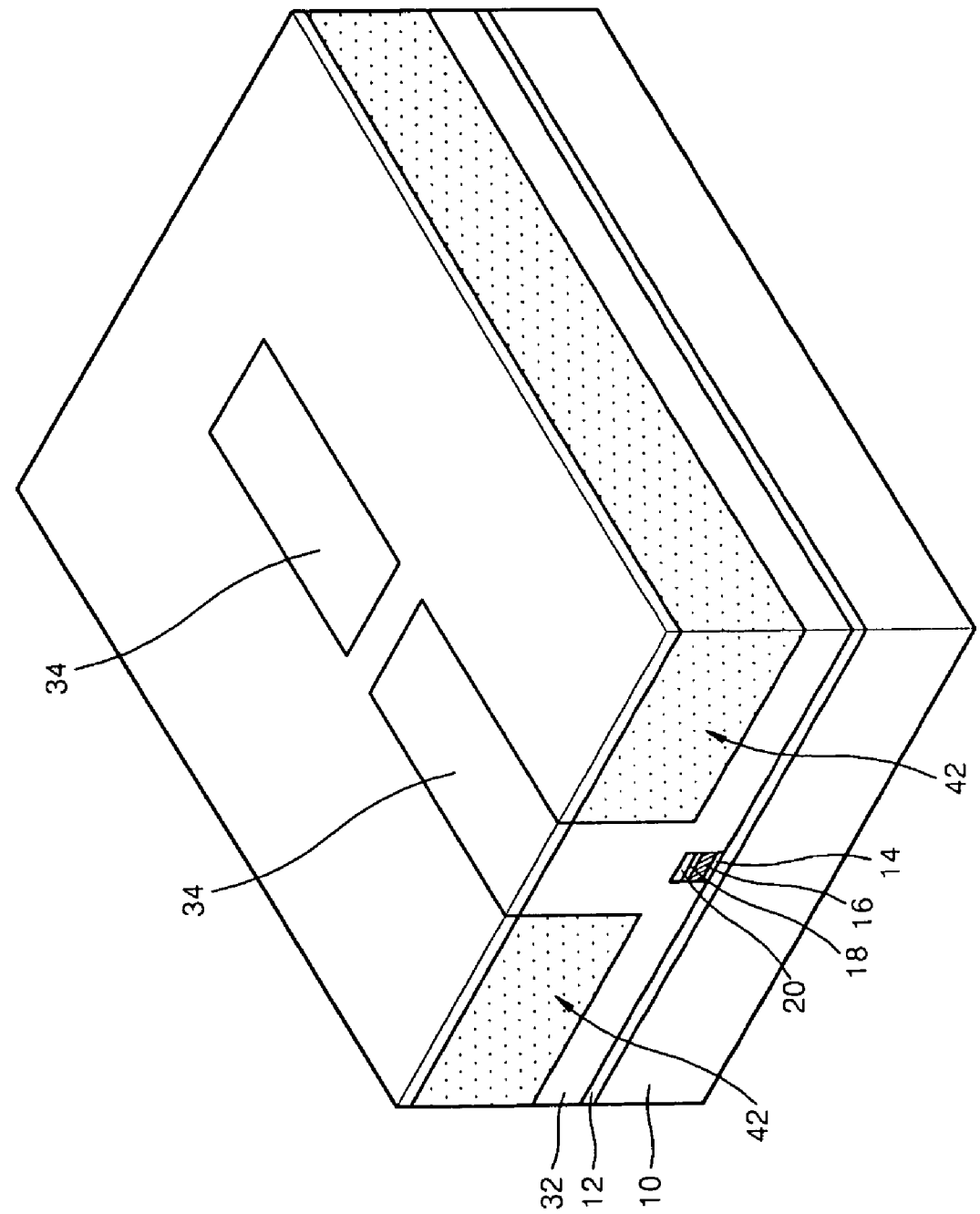

Referring FIG. 6, the first and the second photo-resist stripe pattern 40a and 40b are removed, by boiling and plasma ashing using an ACT-1 stripper manufactured by Electronic Chemicals. Thereafter, an InP passivation layer (not shown), is removed from the p-InGaAs ohmic contact layer 34 by etching with a solution of $H_3PO_4:HCl$=85:15 (weight ratio) for about two minutes. While removing the InP layer, any remains of the first and the second photo-resist stripe pattern 40a and 40b are completely removed. As a result, the p-InGaAs ohmic contact layer 34 is completely exposed.

Figure 7:
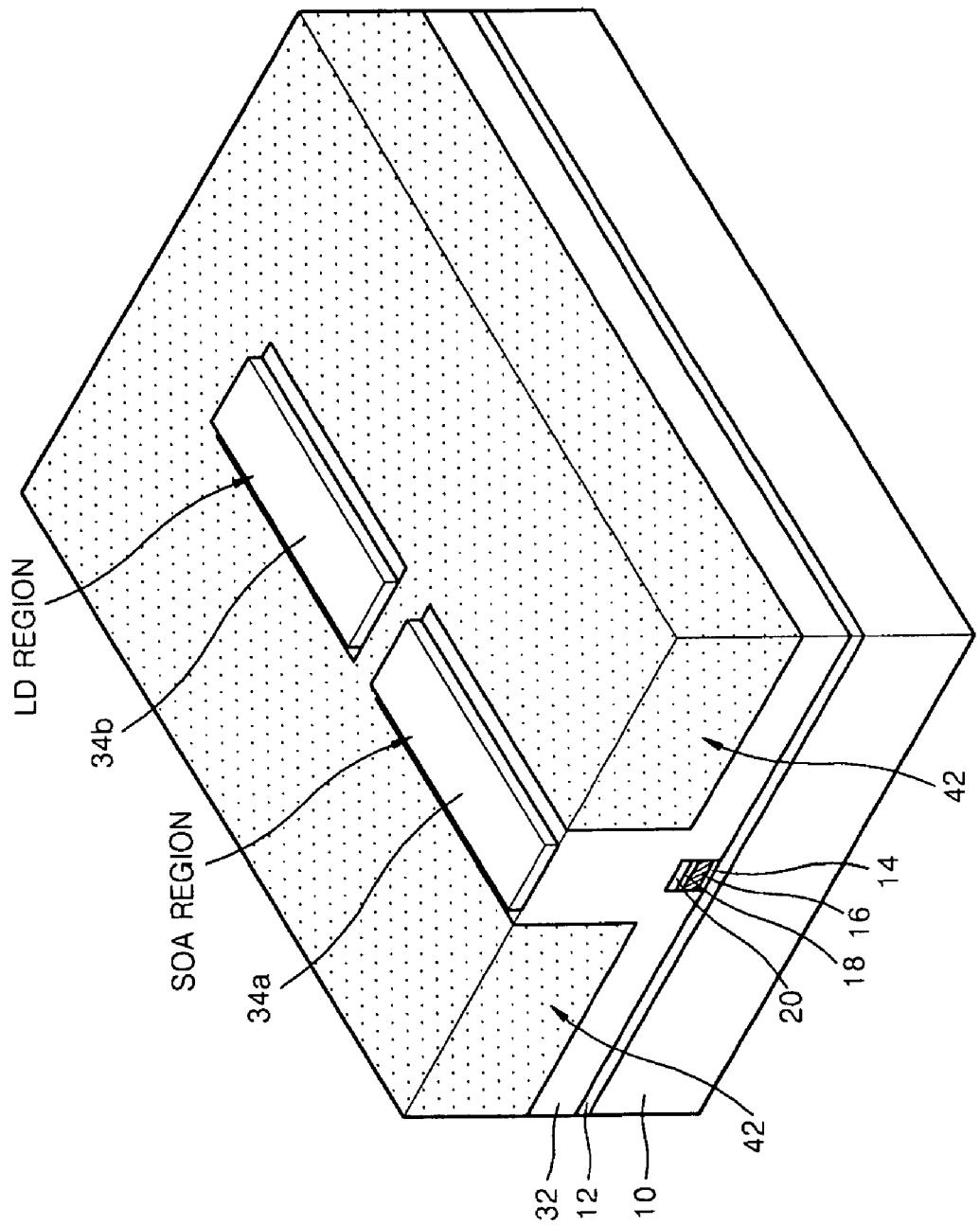

Referring to FIG. 7, the p-InGaAs ohmic contact layer 34 having the fully exposed top surface is patterned to become the first p-InGaAs contact pattern 34a and the second p-InGaAs ohmic contact pattern 34b in the SOA region and the LD region.

Wet-etching may be used to pattern the p-InGaAs ohmic contact layer 34. That is, an oxidation layer (not shown) is formed on the p-InGaAs ohmic contact layer 34, and a photo-resist pattern (not shown) is formed on the oxidation layer extending in the same direction as the active layer 16 and having a width of 4 μm based on the active layer 16 stripe pattern as a center. An oxidation layer pattern is formed by etching the oxidation layer (not shown) using the photo-resist pattern (not shown) by MERIE. Thereafter, the photo-resist pattern which was used as the etching mask is removed. After removal, the p-InGaAs ohmic contact layer 34 is wet-etched using the oxidation layer pattern as an etching mask. For example, the wet-etching may be performed using a solution $H_3PO_4:H_2O_2:H_2O$=1:1:10 (weight ratio) for about 60 seconds. After wet-etching, the oxidation layer pattern which was used as the etching mask is removed. As a result, the first p-InGaAs ohmic contact pattern 34a remains in the SOA region and the second p-InGaAs ohmic contact pattern 34b remains in the LD region on the n-InP substrate 10 as shown in FIG. 7.

Figure 8:
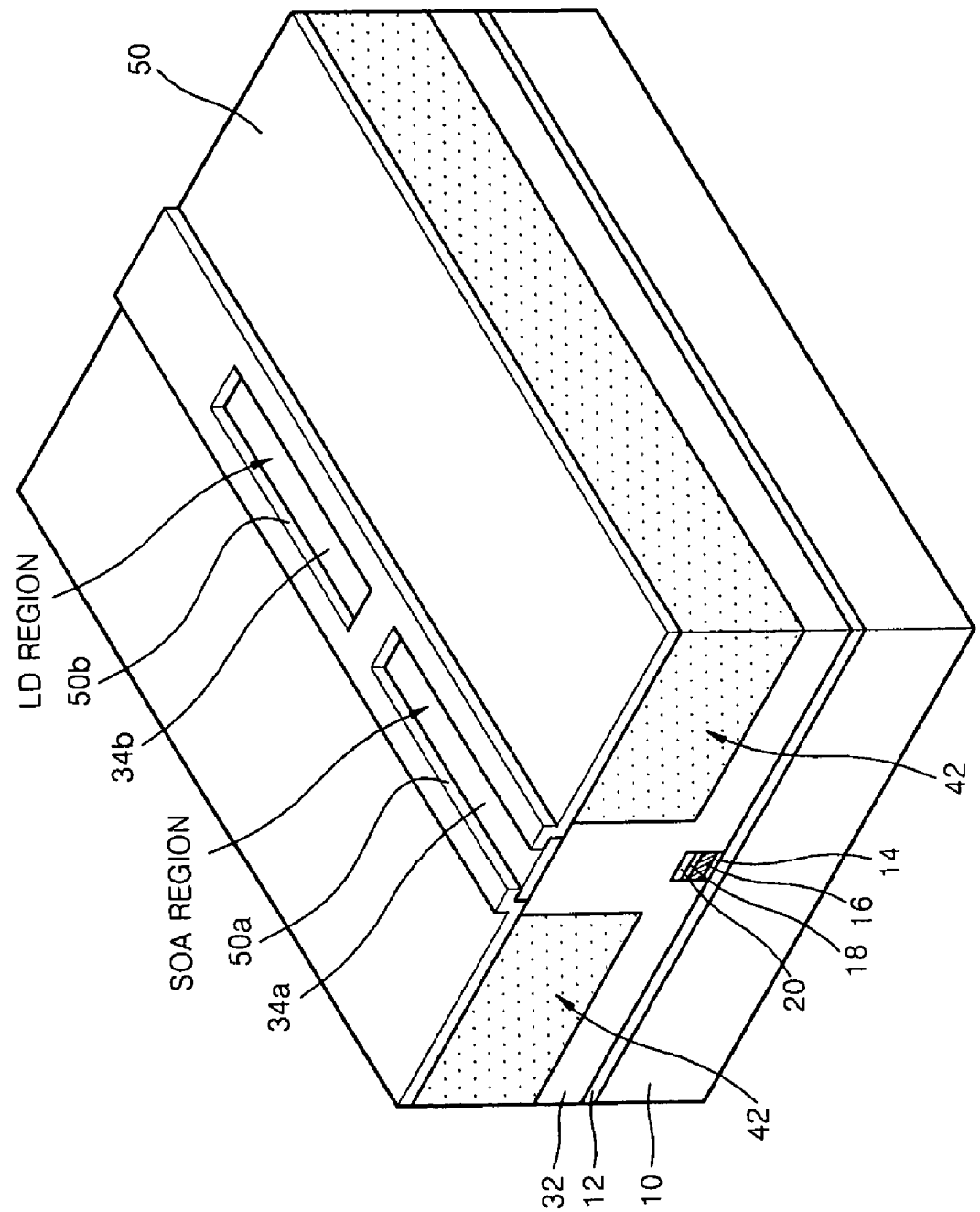

Referring to FIG. 8, a second insulating layer is formed on the entire surface of the structure shown in FIG. 7 having the exposed first p-InGaAs ohmic contact layer pattern 34a and second p-InGaAs ohmic contact layer pattern 34b. The second insulating layer is then patterned by photolithography to form a second insulating layer pattern 50 having a first opening 50a exposing the first p-InGaAs ohmic contact layer pattern 34a in the SOA region and a second opening 50b exposing the second p-InGaAs ohmic contact pattern 34b in the LD region. For example, the second insulating layer pattern 50 may be made of an oxidation layer. The second insulating layer pattern 50 electrically isolates all regions except the current injection region on the n-InP substrate 10.

Figure 9:
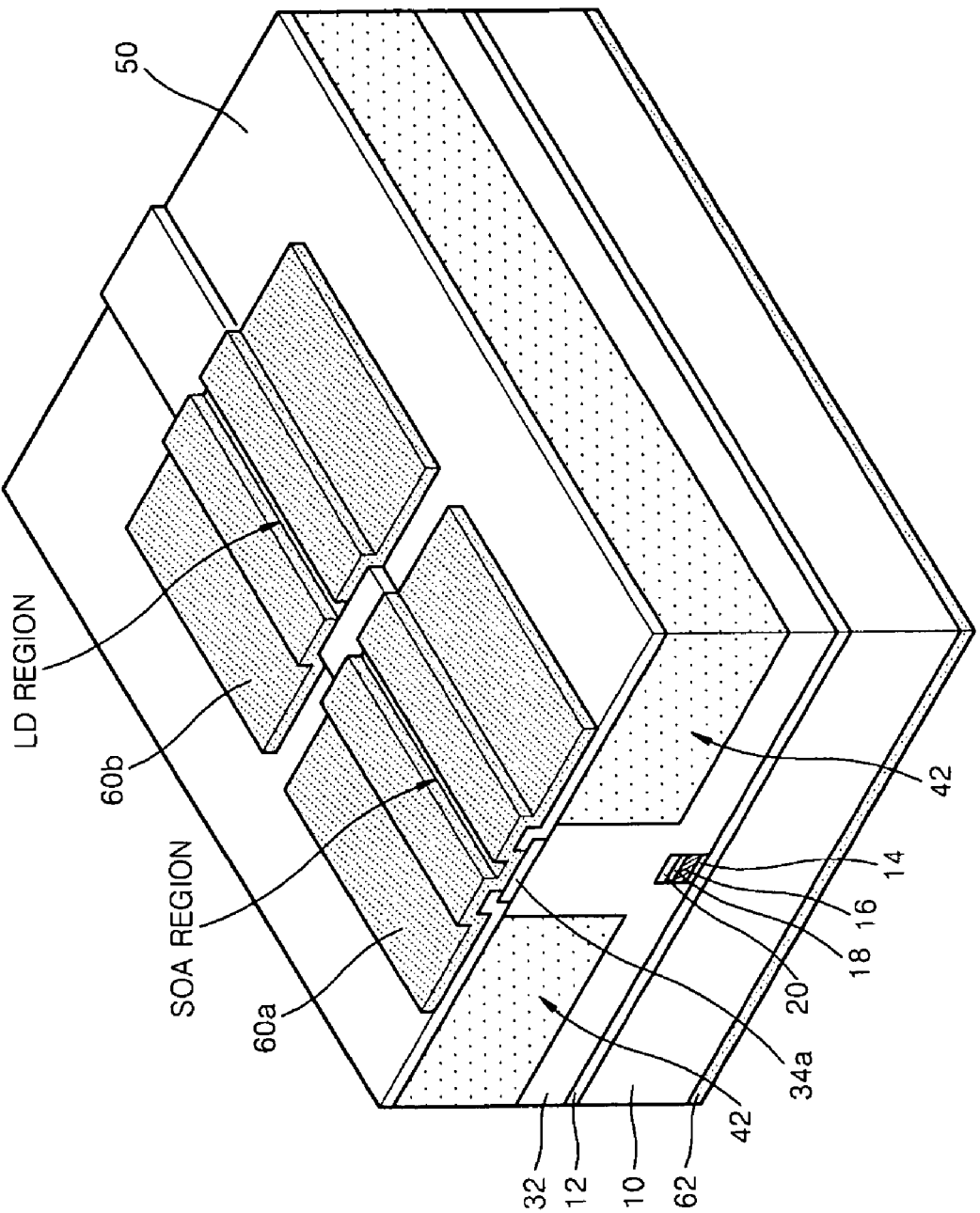

Referring to FIG. 9, a first metal layer pattern 60a is formed on the second insulating layer pattern 50 to cover the first p-InGaAs ohmic contact layer pattern 34a that is exposed through the first opening 50a in the SOA region. Also, a second metal layer pattern 60b is formed on the second insulating layer pattern 50 to cover the second p-InGaAs ohmic contact layer pattern 34b that is exposed through the second opening 50b in the LD region. The first metal layer pattern 60a and the second metal layer pattern 60b are electrically separated. A p-type metals such as Au/Pt/Ti may be used to form the first metal layer pattern 60a and the second metal layer pattern 60b.

An example of a process for forming the first metal layer pattern 60a and the second metal layer pattern 60b will now be described. First, a photo-resist pattern (not shown) having holes exposing a predetermined region is formed on the second insulating layer pattern 50. The holes of the photoresist pattern expose the first p-InGaAs ohmic contact layer pattern 34a and the second p-InGaAs ohmic contact layer pattern 34b through the first opening 50a and the second opening 50b, respectively, and expose its neighboring regions of the second insulating layer pattern 50 with the first opening 50a and the second opening 50b as a center. Thereafter, p type metals such as Au/Pt/Ti are deposited in a region where a P type metal pad and a metal stripe are to be formed, using e-beam evaporation. After deposition, the first metal layer pattern 60a and the second metal layer pattern 60b are formed in the SOA region and the LD region through annealing for ohmic contact.

Thereafter, a lapping process is performed to grind a backside of the n-InP substrate 10 by about 100 μm in order to give the n-InP substrate 10 a uniform thickness and flatness. N-type metals such as Au/Cr are deposited on the backside of the lapped n-InP substrate 10 and annealed to form a metal electrode layer 62. Different metal electrodes are used for the first metal layer pattern 60a, the second metal layer pattern 60b and the metal electrode layer 62.

An antireflection layer (not shown) is coated on the SOA output surface of a broadband light source device fabricated as described above.

The SLD fabricated by the method according to the present embodiment includes the SOA region and the LD region. The SOA region includes a spot size converter structure and the LD region has a bent waveguide structure at its rear portion.

In order to suppress oscillation, the SLD according to the present embodiment includes the antireflection layer deposited on the optical output surface of the SOA region. An electrode in the SOA region and an electrode in the LD region are electrically isolated from each other by ion-implantation. Current is independently injected into each of the electrodes in the SOA region and the LD region.

The method of fabricating the SLD according to the present embodiment includes forming an active layer on an InP substrate, forming a ridge structured active layer by photolithography and dry-etching, forming a BRS by growing a p-InP layer as a clad layer and a p-InGaAs layer as an ohmic contact layer, forming a SOA region and a LD region by ion-implantation and current-injection metal layer deposition, and coating an optical output surface with an antireflection layer in order to suppress oscillation. In the method of fabricating the SLD according to the present embodiment, operations for forming a current blocking region by ion-implantation and optically connecting the electrodes while electrically isolating the electrodes from each other are very importantly for device performance. The fabrication method according to the present embodiment may produce an SLD that outputs light of 1.55 μm wavelength with high output power and broadband characteristics by integrally forming the SOA region and the LD region on the same active layer and using the SOA region to amplify the light emitted from the LD region.

Figure 10:
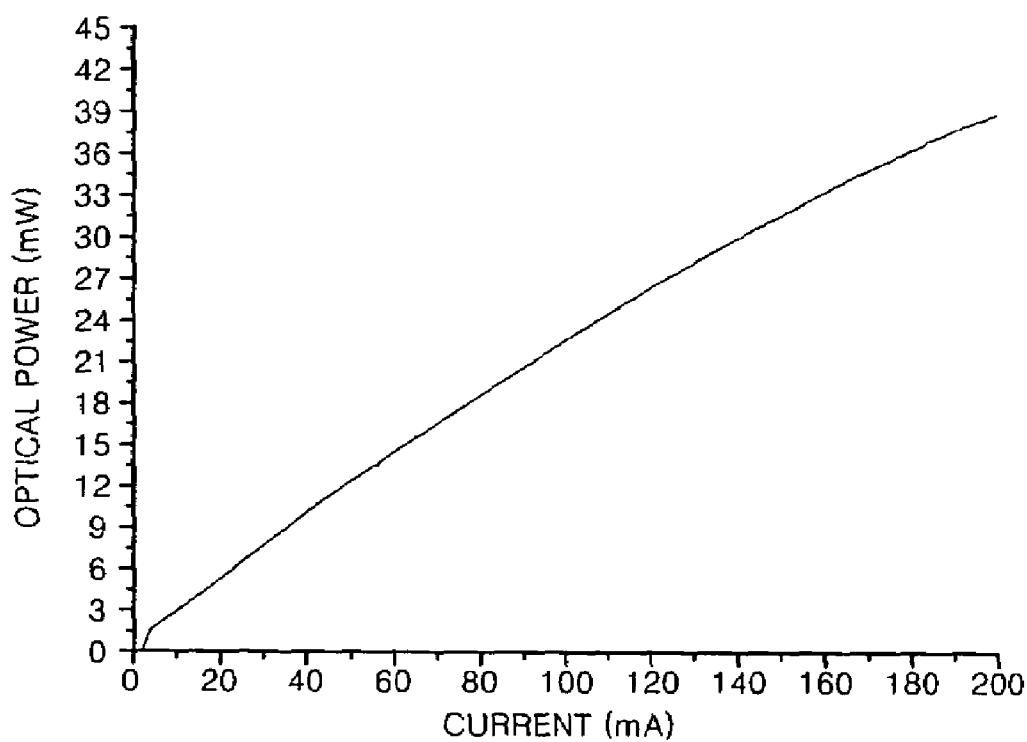
FIG. 10 is a graph of injection current vs. optical power of the SLD of FIG. 9.

FIG. 10 is a graph of injection current vs. optical power of the SLD of FIG. 9.

Figure 11:
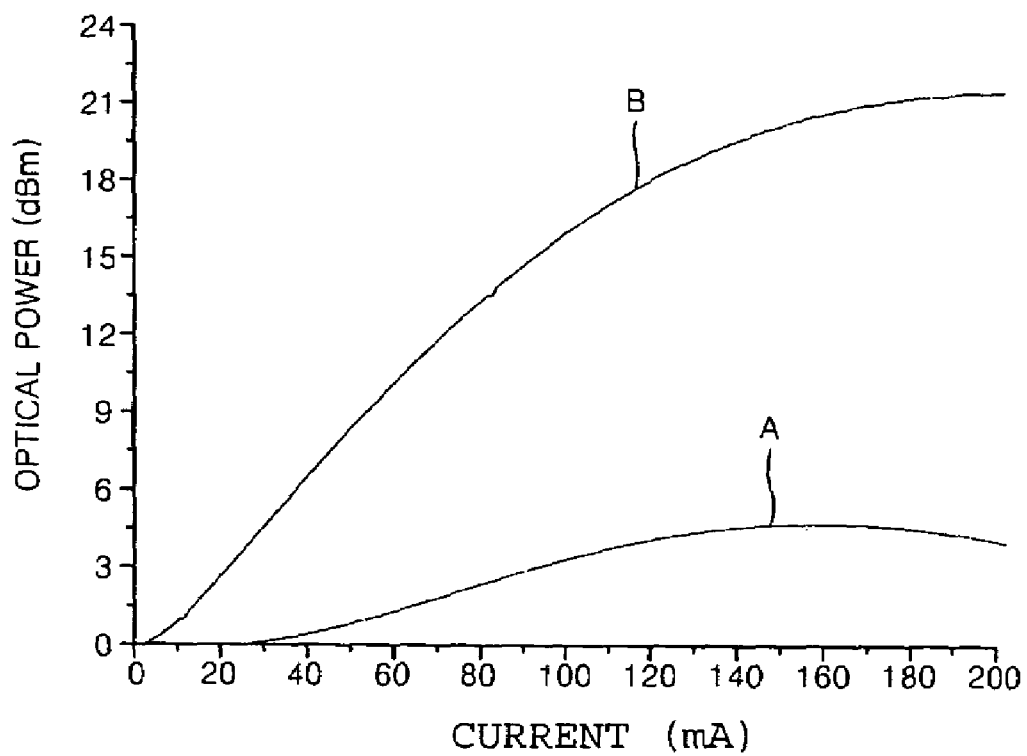
FIG. 11 is a graph showing a current-optical power characteristic of the SLD of FIG. 9.

FIG. 11 is a graph showing a current-optical power characteristic of the SLD of FIG. 9.

Figure 12:
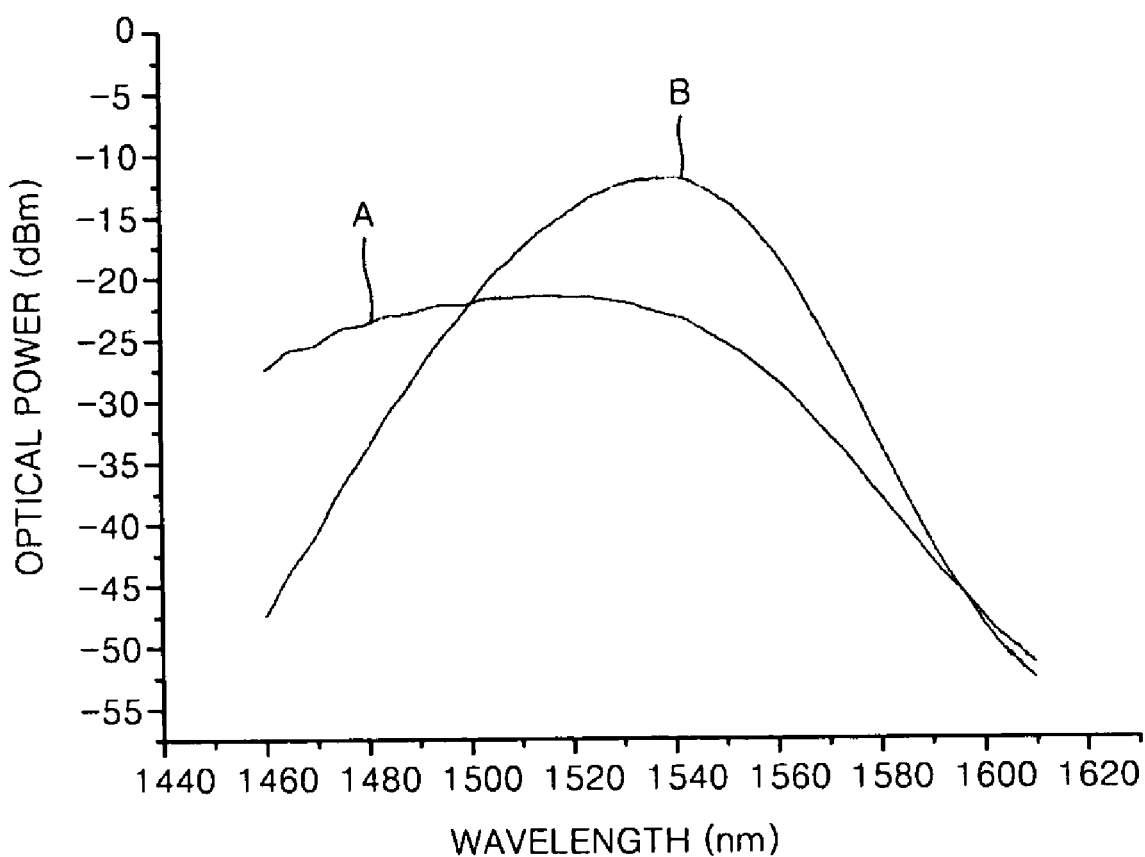
FIG. 12 is a graph showing spectrum characteristics of the SLD of FIG. 9.

FIG. 12 is a graph showing spectrum characteristics of the SLD of FIG. 9.

Referring to FIG. 11, a curve (A) shows the optical power of the SLD according to the present embodiment when no current is injected into the LD electrode while changing the current injected into the SOA electrode. A curve (B) shows the optical power of the SLD according to the present embodiment when a fixed current of 100 mA is injected into the LD electrode while changing the current injected into the SOA electrode. In the case of operating the SOA electrode only, the SLD optical power output is about 4 mW at a current of 200 mA. In this case, the optical power spectrum shows wide bandwidth of typical SOA output characteristics as shown in FIG. 12.

As shown in FIG. 12, the SLD according to the present embodiment generates a high optical power of 23 mW if the fixed current of 100 mA is injected into the LD electrode and the current injected into the SOA electrode is increase to 200 mA. This is a result of amplifying the light in the SOA region. In this case, the optical power spectrum has a 3 dB bandwidth of 25 nm, and the optical power is −10 dBm at a wavelength of 1.55 μm.

The preferred embodiments described above should be considered in a descriptive sense only and not for purposes of limitation.

The SLD according to the present invention has a two electrode structure including a semiconductor optical amplifying (SOA) region that amplifies light generated by a laser diode (LD) region 10 times. In order to transform light to superluminescent light by suppressing laser oscillation in the LD region and the SOA region, the antireflection layer is deposited on the output surface of the SOA region, and the bent waveguide is formed at a rear portion of the LD region. Also, the spot size converter structure is formed at the active layer of the light output portion in order to increase the coupling efficiency between the output light and the optical fiber. The SLD according to the present invention includes a single active layer containing the LD and the SOA. Therefore, the present invention introduces two high power semiconductor laser structures for suppressing oscillation.

According to the present invention, the 1.55 μm SLD may be manufactured by forming two electrodes for the SOA and LD at the same time. By forming the SOA and the LD on the same active layer, the 1.55 μm SLD outputs high power and has broadband characteristics.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A superluminescent diode (SLD) comprising:
   an InP substrate having a LD (laser diode) region and a SOA (semiconductor optical amplifier) region for amplifying light emitted from the LD region;
   an optical waveguide having a BRS (buried ridge stripe) structure having an active layer of resonant stripe pattern formed on the InP substrate and extending from the SOA region to the LD region wherein the active layer comprising a plurality of alternating unstrained barrier layers and strained quantum well layers;

a first electrode formed on the active layer in the SOA region;

a second electrode formed on the active layer in the LD region and electrically isolated from the first electrode; and a current blocking region interposed between the first electrode and the second electrode to electrically isolate the first electrode and the second electrode from each other wherein the current blocking region is formed of an ion-implanted InP clad layer that is formed on the active layer.

2. The SLD of claim 1, wherein the active layer comprises a multi-quantum well formed of alternately deposited unstrained In GaAsP barriers and InGaAsP strained well layers.

3. The SLD of claim 1, wherein a p-InP clad layer and a p-InGaAs ohmic contact layer are sequentially stacked between the active layer and the first electrode, and between the active layer and the second electrode.

4. The SLD of claim 1, further comprising an antireflection layer coated on a light output surface of the SOA region.

5. The SLD of claim 1, wherein the active layer in the LD region has a bent waveguide structure.

6. The SLD of claim 1, wherein the unstrained barrier layers and the strained quantum well layers having substantially the same stoichiometry.

7. The SLD of claim 1, wherein the unstrained barrier layers comprise unstrained barrier InGaAsP layers and the strained quantum well layers comprise strained quantum well InGaAsP layers.

8. A superluminescent diode (SLD) comprising:

an InP substrate having a LD (laser diode) region and a SOA (semiconductor optical amplifier) region for amplifying light emitted from the LD region;

an optical waveguide having a BRS (buried ridge stripe) structure having an active layer of resonant stripe pattern formed on the InP substrate and extending from the SOA region to the LD region wherein the active layer comprising a plurality of alternating unstrained barrier layers and strained quantum well layers, wherein the unstrained barrier avers comprise unstrained barrier InGaAsP layers and the strained quantum well layers comprise strained quantum well InGaAsP layers, wherein the unstrained InGaAsP barrier layers having an emission wavelength of about 1.68 μm and the strained quantum well InGaAsP layers having an emission wavelength of about 1.3 μm;

a first electrode formed on the active layer in the SOA region;

a second electrode formed on the active layer in the LD region and electrically isolated from the first electrode; and a current blocking region interposed between the first electrode and the second electrode to electrically isolate the first electrode and the second electrode from each other.

9. A superluminescent diode (SLD) comprising:

an InP substrate having a LD (laser diode) region and a SOA (semiconductor optical amplifier) region for amplifying light emitted from the LD region;

an optical waveguide having a BRS (buried ridge stripe) structure having an active layer of resonant stripe pattern formed on the InP substrate and extending from the SOA region to the LD region wherein the active layer comprising a plurality of alternating unstrained barrier layers and strained quantum well layers, wherein the unstrained barrier layers comprise unstrained barrier InGaAsP layers and the strained quantum well layers comprise strained quantum well InGaAsP layers, a first electrode formed on the active layer in the SOA region;

a second electrode formed on the active layer in the LD region and electrically isolated from the first electrode; and a current blocking region interposed between the first electrode and the second electrode to electrically isolate the first electrode and the second electrode from each other wherein the SLD emits a relative high optical emission power of at least 20 mW when a LD current of about 100 mA in injected into the LD region and a SOA current of about 200 mA is injected into the SOA region.

10. The SLD of claim 9, wherein the SLD emits an optical power spectrum having a 3 dB bandwidth of about 25 nm.

11. The SLD of claim 8 further comprising a backside electrode deposited on the InP substrate, wherein the backside electrode comprises an n-type metal.

12. The SLD of claim 8 wherein the first electrode comprises:

a p-InP clad layer;

a p-InGaAs Ohmic contact layer on the p-InP clad layer; and a first metal layer pattern on the p-InGaAs Ohmic contact layer, wherein the first metal layer pattern is made of p-type metals selected from the group consisting of gold, platinum, titanium and admixtures thereof.

13. The SLD of claim 8 wherein the second electrode comprises:

a p-InP clad layer;

a p-InGaAs Ohmic contact layer on the p-InP clad layer;

a second metal layer pattern on the p-InGaAs Ohmic contact layer, wherein the second metal layer pattern is made of p-type metals selected from the group consisting of gold, platinum, titanium and admixtures thereof.

14. The SLD of claim 1 further comprising a backside electrode deposited on the InP substrate, wherein the backside electrode comprises an n-type metal.

15. The SLD of claim 1 wherein the first electrode comprises:

a p-InP clad layer;

a p-InGaAs Ohmic contact layer on the p-InP clad layer; and a first metal layer pattern on the p-InGaAs Ohmic contact layer, wherein the first metal layer pattern is made of p-type metals selected from the group consisting of gold, platinum, titanium and admixtures thereof.

16. The SLD of claim 1 wherein the second electrode comprises:

a p-InP clad layer;

a p-InGaAs Ohmic contact layer on the p-InP clad layer;

a second metal layer pattern on the p-InGaAs Ohmic contact layer, wherein the second metal layer pattern is made of p-type metals selected from the group consisting of gold, platinum, titanium and admixtures thereof.

* * * * *